US012811111B2

(12) United States Patent
Cheon et al.

(10) Patent No.: US 12,811,111 B2
(45) Date of Patent: Nov. 24, 2026

(54) SUBSTRATE PROCESSING APPARATUS INCLUDING EDGE BIAS SUPPLY PORTION

(71) Applicant: SAMSUNG ELECTRONICS CO., LTD., Suwon-si (KR)

(72) Inventors: Woongjin Cheon, Suwon-si (KR); Donghyeon Na, Suwon-si (KR); Kyung-Sun Kim, Suwon-si (KR); Jaebin Kim, Suwon-si (KR); Jaesung Kim, Suwon-si (KR); Jong In Park, Suwon-si (KR); Myeongsoo Shin, Suwon-si (KR); Jimo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 18/807,142

(22) Filed: Aug. 16, 2024

(65) Prior Publication Data

US 2025/0273443 A1 Aug. 28, 2025

(30) Foreign Application Priority Data

Feb. 28, 2024 (KR) ........................ 10-2024-0028788

(51) Int. Cl.
*H01J 37/32* (2006.01)
*H10P 72/72* (2026.01)

(52) U.S. Cl.
CPC .. *H01J 37/32697* (2013.01); *H01J 37/32183* (2013.01); *H01J 37/32642* (2013.01); *H01J 37/32715* (2013.01); *H01J 37/32935* (2013.01); *H10P 72/722* (2026.01); *H01J 2237/334* (2013.01)

(58) Field of Classification Search
CPC ........... H01J 37/32091; H01J 37/32174; H01J 37/32642; H01J 37/32715; H01J 2237/334; H01J 37/32183
See application file for complete search history.

(56) References Cited

U.S. PATENT DOCUMENTS

| | | | | |
|---|---|---|---|---|
| 10,163,610 | B2 | 12/2018 | Sriraman et al. | |
| 10,283,330 | B2 | 5/2019 | Marakhtanov et al. | |
| 10,755,897 | B2 | 8/2020 | Ikeda et al. | |
| 2018/0025891 | A1 | 1/2018 | Marakhtanov et al. | |
| 2023/0092887 | A1 | 3/2023 | Hopkins et al. | |
| 2023/0215735 | A1 | 7/2023 | Liao et al. | |
| 2024/0062991 | A1* | 2/2024 | Koshimizu ....... | H01J 37/32146 |
| 2025/0087462 | A1* | 3/2025 | Guo ................. | H01J 37/32183 |

FOREIGN PATENT DOCUMENTS

| | | | |
|---|---|---|---|
| JP | 2023-516739 | A2 | 4/2023 |
| KR | 10-2120738 | B1 | 6/2020 |
| KR | 10-2023-0105658 | A | 7/2023 |

* cited by examiner

*Primary Examiner* — Wei (Victor) Y Chan
(74) *Attorney, Agent, or Firm* — MORGAN, LEWIS & BOCKIUS LLP

(57) ABSTRACT

A substrate processing apparatus includes a chamber, a support member disposed inside the chamber and including a bias electrode and an edge bias electrode, a bias supply portion electrically connected to the bias electrode, and an edge bias supply portion electrically connected to the edge bias electrode.

18 Claims, 17 Drawing Sheets

1

SUBSTRATE PROCESSING APPARATUS INCLUDING EDGE BIAS SUPPLY PORTION

CROSS-REFERENCE TO RELATED APPLICATION

This application claims priority to and the benefit of Korean Patent Application No. 10-2024-0028788 filed in the Korean Intellectual Property Office on Feb. 28, 2024, the entire contents of which are herein incorporated by reference.

BACKGROUND

(a) Technical Field

The present disclosure relates to a substrate processing apparatus, and more particularly to a substrate processing apparatus including an edge bias supply portion.

(b) Discussion of Related Art

The manufacture of semiconductor devices typically involves various processes performed on a substrate. These processes may include photolithography, etching, ashing, ion implantation, thin film deposition, and cleaning. These processes may be performed on the substrate to form a desired pattern. For example, the etching process may remove a portion of a film formed on the substrate, where a remaining portion of the film forms the pattern. The etching process may be a wet etching or a dry etching.

Dry etching may be performed to remove a portion of the film by bombarding the film with plasma. Typically, to form plasma, an electromagnetic field may be formed in an inner space of a chamber, and the electromagnetic field may excite a process gas provided in the chamber into a plasma state.

Plasma may refer to an ionized gas state composed of ions, electrons, and radicals. Plasma may be generated by high temperatures, strong electric fields, or strong radio frequency (RF) electromagnetic fields.

SUMMARY OF THE INVENTION

The present disclosure describes a substrate processing apparatus that may process a substrate in which a state of a sheath (of a plasma) may be effectively adjusted.

However, objects of the present disclosure are not limited thereto, and may be extended in various ways within the spirit and scope of the present disclosure.

An embodiment provides a substrate processing apparatus including: a chamber; a support member disposed inside the chamber and including a bias electrode and an edge bias electrode; a bias supply portion electrically connected to the bias electrode; and an edge bias supply portion electrically connected to the edge bias electrode, wherein the edge bias supply portion applies a coupling control signal having a frequency corresponding to a coupling signal, and the coupling signal is generated at the edge bias electrode by coupling with a bias signal generated at the bias electrode.

Another embodiment provides a substrate processing apparatus including: a chamber; a support member disposed inside the chamber and including a bias electrode and an edge bias electrode; a bias supply portion electrically connected to the bias electrode; an edge bias supply portion electrically connected to the edge bias electrode; and a measurement member electrically connected to the edge bias electrode, wherein the measurement member measures a coupling signal generated at the edge bias electrode by coupling with a bias signal generated at the bias electrode.

Another embodiment provides a substrate processing apparatus including: a chamber; a support member disposed inside the chamber and including a bias electrode and an edge bias electrode; a bias supply portion electrically connected to the bias electrode; an edge bias supply portion electrically connected to the edge bias electrode; and a measurement member electrically connected to the edge bias electrode, wherein the measurement member measures a coupling signal generated at the edge bias electrode by coupling with a bias signal generated at the bias electrode, and the edge bias supply portion applies a coupling control signal having a frequency corresponding to a reflected signal to generate a synthetic signal in which at least one of an amplitude or a phase of the synthetic signal is different than an amplitude or a phase of the reflected signal, wherein the reflected signal is a portion of the coupling signal traveling in a direction from the edge bias supply portion toward the edge bias electrode.

According to some embodiments, it is possible to provide a substrate processing device that may process a substrate in a state in which a state of a sheath is effectively controlled.

DETAILED DESCRIPTION

Figure 1:
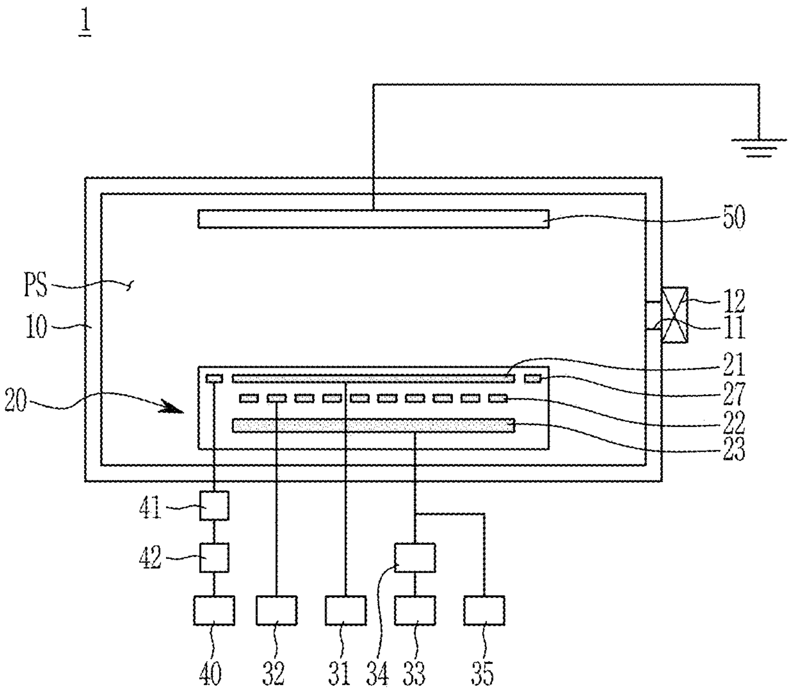
FIG. 1 illustrates a substrate processing apparatus according to an embodiment.

Embodiments of the present disclosure will be described more fully hereinafter with reference to the accompanying drawings. The present disclosure may be implemented in various different forms and is not limited to embodiments provided herein. Embodiments may be modified in various different ways, all without departing from the spirit or scope of the present disclosure. In order to clearly describe aspects of the present disclosure, parts or portions that may be irrelevant to the description may be omitted.

In the drawings, the size and thickness of each element may be arbitrarily illustrated for ease of description. In the drawings, the thicknesses of layers, films, panels, regions, or areas may be exaggerated for clarity. In the drawings, for ease of description, the thicknesses of some layers and areas may be exaggerated.

It will be understood that when an element such as a layer, film, region, area, or substrate is referred to as being "on" or "above" another element, it may be directly on the other element or intervening elements may also be present. In contrast, when an element is referred to as being "directly on" another element, there may be no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" may be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

FIG. 1 illustrates a substrate processing apparatus 1 according to an embodiment.

Referring to FIG. 1, the substrate processing apparatus 1 according to an embodiment may include a chamber 10, a support member 20, and a plasma excitation member 50.

The substrate processing apparatus 1 may process a substrate using plasma. For example, the substrate processing apparatus 1 may perform an etching process using excited plasma. The substrate may be a wafer for manufacturing a semiconductor device. The chamber 10 may have a cylindrical shape. For example, the chamber 10 may include one or more sidewalls connected between a top and a bottom. However, a shape of the chamber 10 is not limited thereto. The chamber 10 may define a process space PS within which a substrate processing process may be performed. The chamber 10 may include an internal process space PS. The internal process space may be a sealed space. An opening 11 may be disposed at a sidewall of the chamber 10. The opening 11 may be opened and closed. The opening 11 may be sealed by a door 12. The chamber 10 may be made of a metallic material. For example, the chamber 10 may be made of an aluminum material. The chamber 10 may be electrically grounded.

The support member 20 may be disposed inside the chamber 10. The support member 20 may be disposed at a lower portion of the process space PS. The support member 20 may support the substrate. The support member 20 may fix the substrate using an electrostatic force.

The support member 20 may have a cylindrical shape. However, a shape of the support member 20 is not limited thereto. The support member 20 may define an inner area. The support member 20 may include a fixing electrode 21, a heating member 22, a lower electrode 23, and an edge bias electrode 27.

The fixing electrode 21 may allow an electrostatic force for fixing the substrate to be generated. The fixing electrode 21 may be disposed in the inner area of the support member 20. A fixing supply portion 31 may be connected to the support member 20. The fixing supply portion 31 may be electrically connected to the fixing electrode 21. The fixing supply portion 31 may include a direct current (DC) power source. An electrostatic force may be generated between the fixing electrode 21 and the substrate by a voltage applied by the fixing supply portion 31, and the electrostatic force may cause the substrate to be fixed to the support member 20.

The heating member 22 may generate heat. The heating member 22 may generate heat for heating the substrate. The heating member 22 may be disposed in an inner area of the support member 20. The heating member 22 may generate heat through resistance heating when power is applied thereto, which may cause the substrate disposed on the support member 20 to be heated. The heating member 22 may be made of a conductive material. The heating member 22 may be disposed below the fixing electrode 21.

A heating supply portion 32 may be connected to the support member 20. The heating supply portion 32 may be electrically connected to the heating member 22. The heating member 22 may be resistance-heated by power supplied by the heating supply portion 32, and the substrate disposed on the support member 20 may be heated.

The lower electrode 23 may allow energy for plasma excitation to be applied to the process space PS. The lower electrode 23 may be disposed in the inner area of the support member 20. The lower electrode 23 may be made of a conductive material. The lower electrode 23 may be made of a metallic material.

An excitation supply portion 33 may be connected to the support member 20. The excitation supply portion 33 may be electrically connected to the lower electrode 23. The excitation supply portion 33 may be provided as a high-frequency power source that may generate high-frequency power. The excitation supply portion 33 may be provided as an RF power source. The excitation supply portion 33 may provide power for plasma excitation. The excitation supply portion 33 may be connected to the lower electrode 23 through a matcher 34. The matcher 34 may be disposed between the excitation supply portion 33 and the lower electrode 23 to perform an RF impedance matching operation.

In addition, the excitation supply portion 33 electrically connected to the lower electrode 23 may be omitted, and the lower electrode 23 may be electrically grounded.

A bias supply portion 35 may be connected to the support member 20. The bias supply portion 35 may be electrically connected to the lower electrode 23. Accordingly, the lower electrode 23 may function as a bias electrode 23. The bias supply portion 35 provides power for bias. The bias may generate an electron sheath (hereinafter "sheath") that may be a thin region of negative charge that acts to accelerate electrons out of the plasma and reflect ions back into the plasma.

A state of the sheath may be adjusted in an area adjacent to an upper surface of the support member 20 by the power supplied by the bias supply portion 35. As the sheath is adjusted, a concentration state of plasma on the substrate and an incident state of ions on the substrate may be adjusted. Other properties of the plasma may also be adjusted by the bias supply portion 35. A frequency of the bias supply portion 35 may be provided to be lower than that of the excitation supply portion 33. For example, the frequency of the excitation supply portion 33 may be about 50 megahertz (MHz) to hundreds of MHz, and the frequency of the bias supply portion 35 may be about 0.1 MHz to about 15 MHz.

The edge bias electrode 27 may allow a sheath state of an area adjacent to an upper surface of the edge area of the support member 20 to be adjusted. The edge bias electrode 27 may be disposed at an upper end portion of the edge area of the support member 20.

An edge bias supply portion 40 may be connected to the support member 20. The edge bias supply portion 40 may be electrically connected to the edge bias electrode 27. A state of the sheath may be adjusted in an area adjacent to the edge area of the upper surface of the support member 20 by the power supplied by the edge bias supply portion 40. As the sheath is adjusted, a concentration state of plasma on an edge area of the substrate and an incident state of ions on an edge area of the substrate may be adjusted. Other properties of the plasma may also be adjusted by the edge bias supply portion 40.

The edge bias supply portion 40 may be connected to the support member 20 through an impedance control member 42. The edge bias supply portion 40 may be electrically connected to the edge bias electrode 27 through the impedance control member 42. The impedance control member 42 may be disposed between the edge bias supply portion 40 and the edge bias electrode 27. The impedance control member 42 may control a coupling signal generated at the edge bias electrode 27. For example, in the support member 20, a signal (hereinafter, a bias signal) generated by the bias electrode 23 may exist in an area adjacent to the edge bias electrode 27. When the edge bias electrode 27 is coupled with a bias signal in an area adjacent to the edge bias electrode 27, a coupling signal may be generated in the edge bias electrode 27. The impedance control member 42 may be electrically connected to the edge bias electrode 27 and may adjust the coupling signal generated in the edge bias electrode 27.

A measurement member 41 may be connected to the support member 20. The measurement member 41 may be electrically connected to the edge bias electrode 27. The edge bias supply portion 40 may be connected to the edge bias electrode 27 through the measurement member 41. Accordingly, the measurement member 41 may be disposed between the edge bias supply portion 40 and the edge bias electrode 27. The measurement member 41 may be disposed between the impedance control member 42 and the edge bias electrode 27. Further, the measurement member 41 may be disposed closer to the edge bias electrode 27 than the impedance control member 42. The measurement member 41 may measure a coupling signal generated at the edge bias electrode 27.

The plasma excitation member 50 may allow energy for excitation of plasma to be applied to the process space PS. The lower surface of the plasma excitation member 50 may be disposed to face an inner portion of the chamber 10 and a volume of the process space PS. The plasma excitation member 50 may be disposed inside the chamber 10. For example, the plasma excitation member 50 may be manufactured separately from the chamber 10 and connected to the chamber 10. Alternatively, the plasma excitation member 50 may be integrally provided with an upper structure of the chamber 10. For example, the plasma excitation member 50 may be disposed on a lower surface of the top of the chamber 10 In other words, the upper structure of the chamber 10 may function as the plasma excitation member 50.

The plasma excitation member 50 may be disposed in the upper portion of the process space PS. The plasma excitation member 50 may be made of a conductive material. An area of the plasma excitation member 50 may be less than an area of the top of the chamber 10. The plasma excitation member 50 may be disposed to face the support member 20 in a vertical direction.

A process gas introduced into the chamber 10 may be excited into a plasma state by an electromagnetic field generated inside the chamber 10. Specifically, the process gas may be excited into plasma by a capacitively coupled plasma (CCP) source. The capacitively coupled plasma source may include an upper electrode and a lower electrode 23. The upper electrode and the lower electrode 23 may be disposed in the vertical direction to face each other. By applying high frequency power to at least one of the upper electrode and the lower electrode 23, an electromagnetic field may be formed in the space between the upper electrode and the lower electrode 23, and the process gas supplied to the space may be excited in a plasma state. The upper electrode may be the plasma excitation member 50.

The excitation supply portion 33 may be connected to only one of the upper electrode and the lower electrode 23. For example, the upper electrode may be grounded, and the excitation supply portion 33 may be connected the lower electrode 23. Alternatively, the lower electrode 23 may be grounded, and the excitation supply portion 33 may be connected the upper electrode. In another example, the excitation supply portion 33 may be connected to the upper electrode and the lower electrode 23. FIG. 1 illustrates an example case in which the excitation supply portion 33 is connected to the lower electrode 23.

Figure 2:
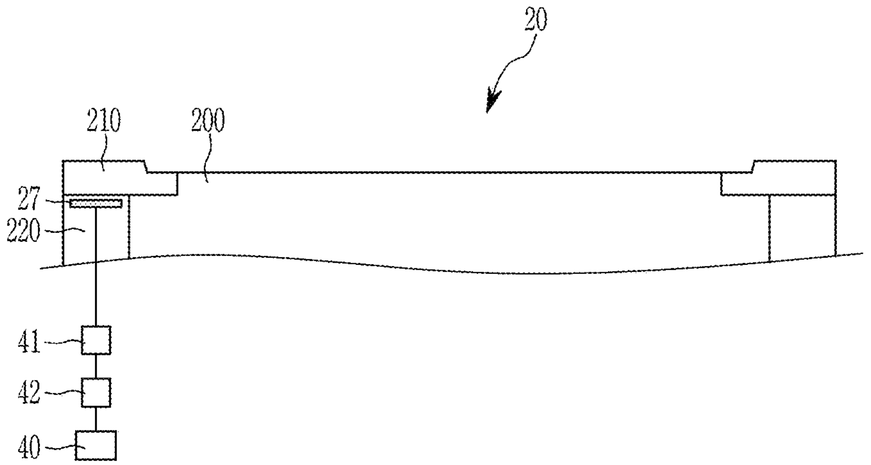
FIG. 2 illustrates an upper portion of a support member of FIG. 1.

FIG. 2 illustrates an upper portion of the support member 20 of FIG. 1.

Referring to FIG. 2, the support member 20 may include a support plate 200, a focus ring 210, and a support ring 220.

The support plate 200 may be disposed in an upper area of the support member 20. Accordingly, at least a portion of the upper surface of the support member 20 may be formed by an upper surface of the support plate 200. The support plate 200 may have a plate structure with a predetermined thickness. An outer surface of the support plate 200 may be circular. For example, the support plate 200 may have a circumference. The outer surface of the support plate 200 may be made of a dielectric substance. A substrate may be disposed on the upper surface of the support plate 200. An area of the upper surface of the support plate 200 may greater than or equal to an area of the substrate.

The fixing electrode 21 may be disposed inside the support plate 200. The heating member 22 may be disposed inside the support plate 200. The lower electrode 23 may be disposed below the support plate 200.

The focus ring 210 may be disposed to be an upper edge portion of the support member 20. The focus ring 210 may define an upper outer circumference of the support member 20.

At least a portion of the focus ring 210 may be disposed on the support plate 200. The focus ring 210 may be disposed on an outer periphery of an upper surface of the support plate 200. The outer periphery of the upper surface of the support plate 200 may be recessed. For example, the outer periphery of the upper surface of the support plate 200 may have a lower height than an inner area of the upper surface of the support plate 200.

A portion of an upper surface of the focus ring 210 may be recessed. For example, a portion of an upper surface of the focus ring 210 adjacent to the support plate 200 may include a step. The step of the focus ring 210 may overlap the outer periphery of the upper surface of the support plate 200.

The focus ring 210 may be provided in a ring shape. The focus ring 210 may define a circumference of the support member 20.

The upper surface of the focus ring 210 may be stepped, and an outer portion of the upper surface of the focus ring 210 may be higher than an inner portion of the upper surface of the focus ring 210. The upper inner portion of the focus ring 210 may be disposed at a height corresponding to the upper surface of the support plate 200. The inner portion of the upper surface of the focus ring 210 may have a height coplanar with the inner area of the upper surface of the support plate 200. When the substrate is disposed on the support member 20, the inner portion of the upper surface of the focus ring 210 and the inner area of the upper surface of the support plate 200 may be disposed below the substrate. The outer portion of upper surface of the focus ring 210 may be disposed to surround the substrate.

The focus ring 210 may improve a uniformity of a density distribution of plasma. The focus ring 210 may be worn during use. As the wear of the focus ring 210 increases, the performance of controlling the density distribution of plasma may deteriorate. Accordingly, the focus ring 210 may be replaced after being used for a certain period of time, a certain number of times, or after a measured wear. However, aspects of the present disclosure are not limited thereto, and the focus ring 210 may be freely replaced.

The support ring 220 may define an outer circumference of the support member 20. The outer circumference of the support member 20 may be disposed below the upper outer circumference of the support plate 200 defined by the focus ring 210. The support ring 220 may surround at least a portion of the outer circumference of the support plate 200. The support ring 220 may have a ring structure in which at least a portion thereof has a height in the vertical direction. Accordingly, an area of the support plate 200 surrounded by the support ring 220 may be isolated from the internal space of the chamber 10. The support ring 220 may be made of an insulating material. The outer circumference of the support plate 200 may be provided to be surrounded by the support ring 220 and the focus ring 210, and the outer circumference of the support plate 200 may be isolated from the internal space of the chamber 10.

An upper surface of the support ring 220 may be disposed at a height corresponding to the outer edge area of the upper surface of the support plate 200. The support ring 220 may be disposed below the focus ring 210. At least a portion of an area of the focus ring 210 may be disposed on the upper surface of the support ring 220. At least a portion of an area of the lower surface of the focus ring 210 may face the upper surface of the support ring 220 in a vertical direction.

The edge bias electrode 27 may be disposed below the focus ring 210. The edge bias electrode 27 may be disposed to face the focus ring 210 in the vertical direction. The edge bias electrode 27 may be disposed inside the support ring 220. The edge bias electrode 27 may be disposed at an upper end portion of the support ring 220. The edge bias electrode 27 may be disposed at a height between the upper surface and the lower surface of the support plate 200 in the vertical direction.

The focus ring 210 may be coupled to the edge bias electrode 27. Accordingly, a state of the sheath in an area adjacent to the upper surface of the focus ring 210 may be adjusted by a signal generated at the edge bias electrode 27.

Figure 3:
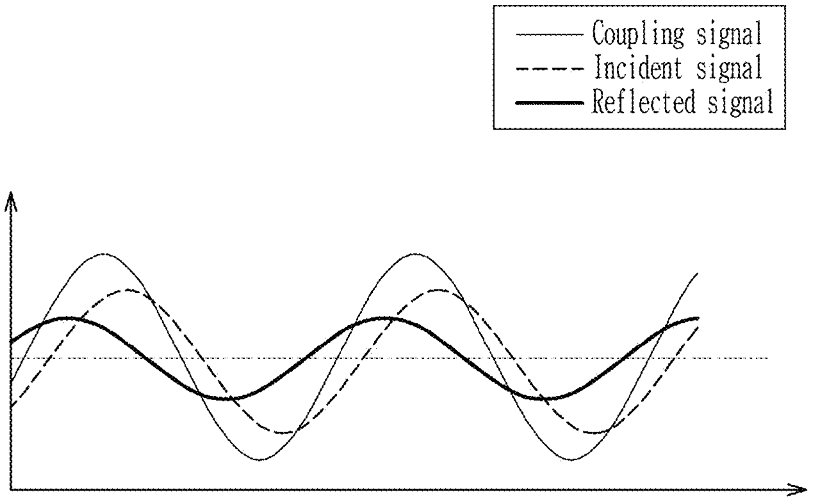
FIG. 3 illustrates a coupling signal generated at an edge bias electrode.

FIG. 3 illustrates a coupling signal generated at the edge bias electrode 27.

The horizontal axis may represent time, and the vertical axis may represent voltage, which may represent the magnitude of the signal.

Referring to FIG. 3, the coupling signal may include an incident signal and a reflected signal.

A bias signal generated from the bias electrode 23 may be applied to the support plate 200. The bias signal may cause the state of the sheath on the upper surface of the support plate 200 to be adjusted. Depending on the state of the sheath, the concentration state of plasma on the substrate and the incident state of ions on the substrate may be adjusted. Other properties of the plasma may also be adjusted by the bias signal. The edge bias electrode 27 may be coupled to the bias signal. The edge bias electrode 27 may be directly coupled to the bias signal of the support plate 200 or may be coupled to the bias signal of the support plate 200 through the focus ring 210. By coupling the bias signal to the edge bias electrode 27, the coupling signal may be generated at the edge bias electrode 27.

The incident signal may be directly generated at the edge bias electrode 27 by coupling with the bias signal. The incident signal may travel in a direction from the edge bias electrode 27 to the edge bias supply portion 40.

A portion of the incident signal may be reflected. For example, a reflected signal may be generated when the incident signal is reflected from the impedance control member 42. The reflected signal may travel in a direction from the edge bias supply portion 40 to the edge bias electrode 27. The incident signal and the reflected signal are illustrated in FIG. 3.

Accordingly, the coupling signal, which is a synthetic signal of the incident signal and the reflected signal, may be generated at the edge bias electrode 27. As the coupling signal is generated according to the coupling of the bias signal and the edge bias electrode 27, the coupling signal may be generated even when the edge bias supply portion 40 is in an off state. The coupling signal may affect the state of the sheath on the upper surface of the focus ring 210.

The measurement member 41 may be electrically connected to the edge bias electrode 27, and may measure the coupling signal. The measurement member 41 may measure the incident signal and the reflected signal separately. The measurement member 41 may be disposed between the edge bias electrode 27 and the edge bias supply portion 40 to measure the reflected signal traveling in a direction from the edge bias supply portion 40 toward the edge bias electrode 27. The measurement member 41 may be disposed between the edge bias electrode 27 and the impedance control member 42 to measure the reflected signal generated when the incident signal is reflected from the impedance control member 42.

The edge bias supply portion 40 may apply the coupling control signal to the edge bias electrode 27. The coupling control signal applied to the edge bias electrode 27 may control the coupling signal generated at the edge bias electrode 27. The coupling control signal applied by the edge bias supply portion 40 may have a frequency corresponding to the coupling signal. The coupling control signal applied by the edge bias supply portion 40 may have a frequency corresponding to the reflected signal. The edge bias supply portion 40 may apply a coupling control signal having a preset phase difference from the reflected signal. That is, by using the reflected signal measured by the measurement member 41, the edge bias supply portion 40 may apply a coupling control signal having a preset phase difference from the reflected signal.

Figure 4:
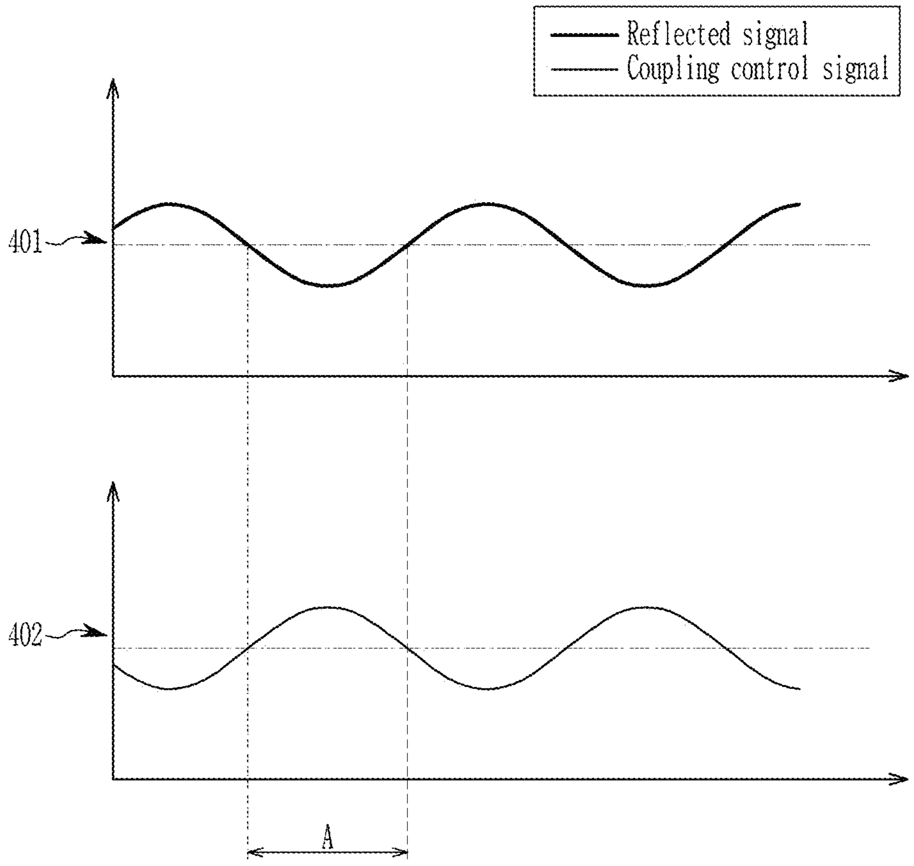
FIG. 4 illustrates a relationship between a coupling control signal and a reflected signal applied by an edge bias supply portion according to an embodiment.

FIG. 4 illustrates a relationship between the coupling control signal applied by the edge bias supply portion 40 and the reflected signal according to an embodiment.

The reflected signal is shown in graph 401, and the coupling control signal is shown in graph 402. The horizontal axis may represent time, and the vertical axis may represent voltage, which may be the magnitude of the signal.

Referring to FIG. 4, the edge bias supply portion 40 may apply a coupling control signal having a phase that destructively interferes with the reflected signal. Destructive interference may occur when different waves interact so that the waves combine to produce a resultant wave with a smaller displacement. That is, the edge bias supply portion 40 may apply a coupling control signal having a phase difference (A) of about 180° relative to the reflected signal. Accordingly, the coupling control signal may destructively interfere with the reflected signal and, and a synthetic signal may be generated in which the coupling control signal and the reflected signal are synthesized.

An amplitude of the coupling control signal may be larger than that of the reflected signal. The amplitude of the coupling control signal may be smaller than that of the reflected signal. The amplitude of the coupling control signal may be the same as that of the reflected signal. The amplitude and phase of the synthetic signal may be adjusted depending on the amplitude of the coupling control signal.

When a coupling control signal having less than twice the amplitude of the reflected signal is applied, the amplitude of the synthetic signal may become smaller than that of the reflected signal. When the amplitude of the coupling control signal is greater than 0 times and less than 1 times the amplitude of the reflected signal, the synthetic signal may have the same phase as the reflected signal and may have a smaller amplitude than the reflected signal. When the amplitude of the coupling control signal is greater than 1 times and less than 2 times the amplitude of the reflected signal, the synthetic signal may have a phase difference of about 180° relative to the reflected signal and may have a smaller amplitude than the reflected signal. When the amplitude of the coupling control signal exceeds twice the amplitude of the reflected signal, the synthetic signal may have a phase difference of about 180° relative to the reflected signal and may have a larger amplitude than the reflected signal. When the amplitude of the coupling control signal is about the same as that of the reflected signal, the generation of the synthetic signal may not be generated. For example, the coupling control signal and the reflected signal may substantially cancel each other and the synthetic signal may have 0 amplitude. For example, when the waveform of the coupling control signal is about the same as that of the reflected signal and the amplitude of the coupling control signal is about the same as that of the reflected signal, the reflected signal may be removed. In addition, when the amplitude of the coupling control signal is twice the amplitude of the reflected signal, the synthetic signal may have a phase difference of about 180° relative to the reflected signal and may have the same amplitude as the reflected signal.

Figure 5:
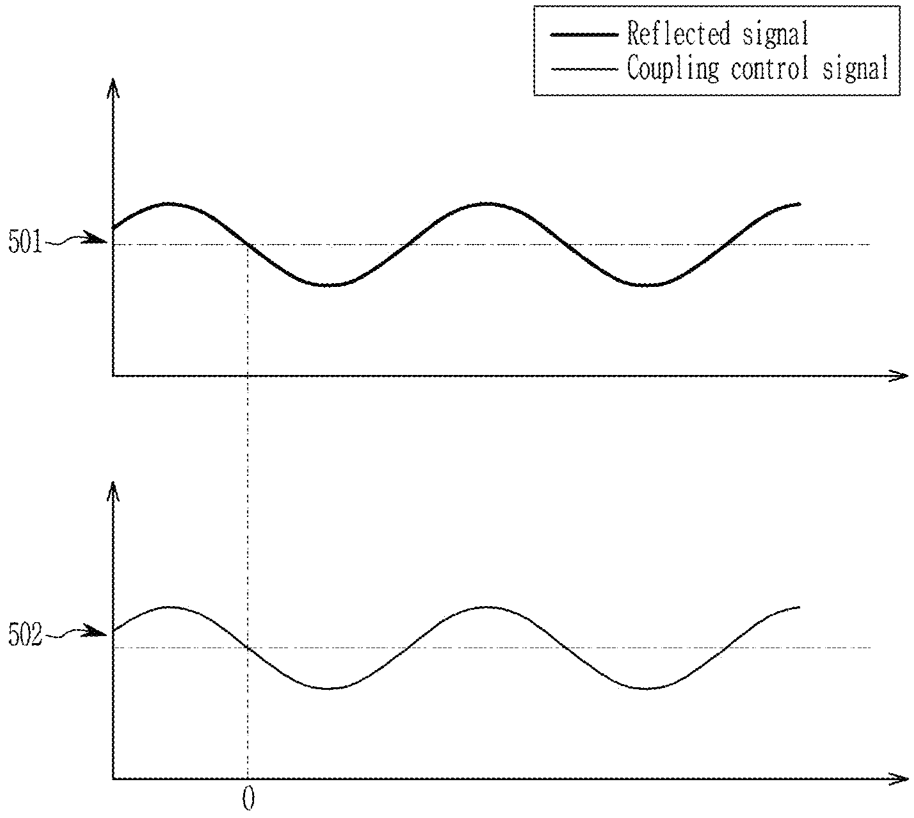
FIG. 5 illustrates a relationship between a coupling control signal and a reflected signal applied by an edge bias supply portion according to another embodiment.

FIG. 5 illustrates a relationship between a coupling control signal applied by the edge bias supply portion 40 and a reflected signal according to another embodiment.

The reflected signal is shown in graph 501, and the coupling control signal is shown in graph 502. The horizontal axis represents time, and the vertical axis is voltage, which is the magnitude of the signal.

Referring to FIG. 5, the edge bias supply portion 40 may apply a coupling control signal having a phase that constructively interferes with the reflected signal. Constructive interference may occur when different waves interact so that the waves produce a resultant wave with a larger displacement. That is, the edge bias supply portion 40 may apply a coupling control signal having the same phase as the reflected signal (that is, a phase difference of about 0° as indicated by line 0). Accordingly, the coupling control signal may constructively interfere with the reflected signal, and a synthetic signal may be generated by the interaction of the reflected signal and the coupling control signal. The coupling control signal applied to the edge bias electrode 27 may have a larger amplitude than the reflected signal.

The amplitude of the coupling control signal may be larger than that of the reflected signal. The amplitude of the coupling control signal may be smaller than that of the reflected signal. The amplitude of the coupling control signal may be the same as that of the reflected signal. The amplitude of the synthetic signal may be adjusted depending on the amplitude of the coupling control signal.

Figure 6:
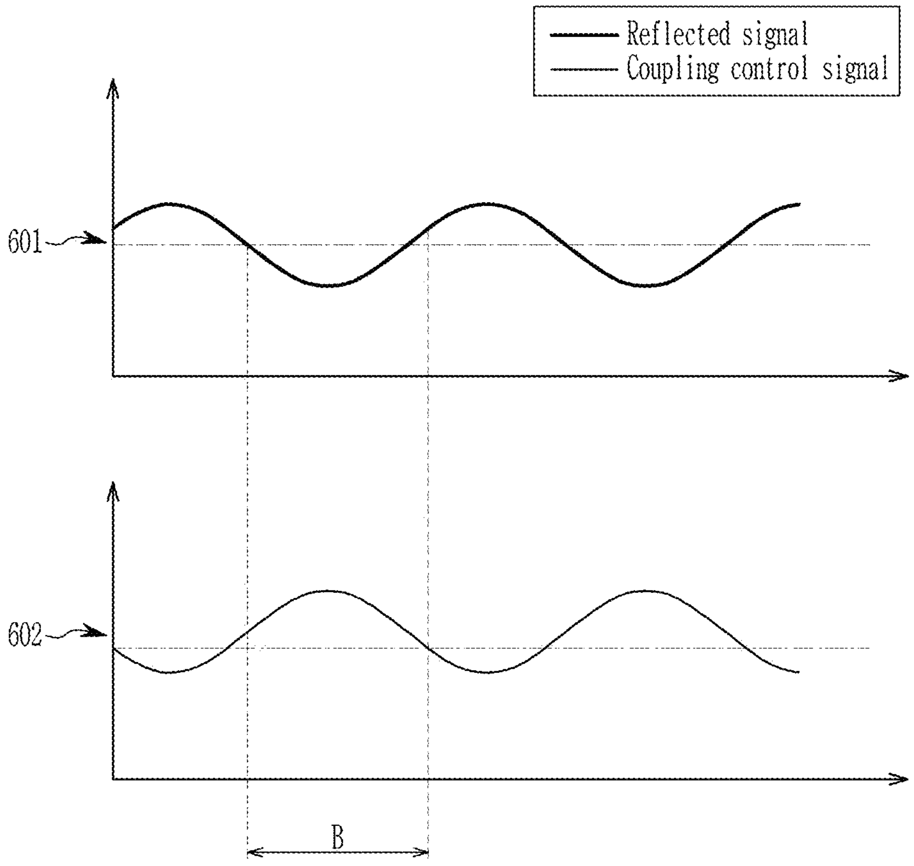
FIG. 6 and FIG. 7 respectively illustrate a relationship between a coupling control signal and a reflected signal applied by an edge bias supply portion according to another embodiment.
Figure 7:
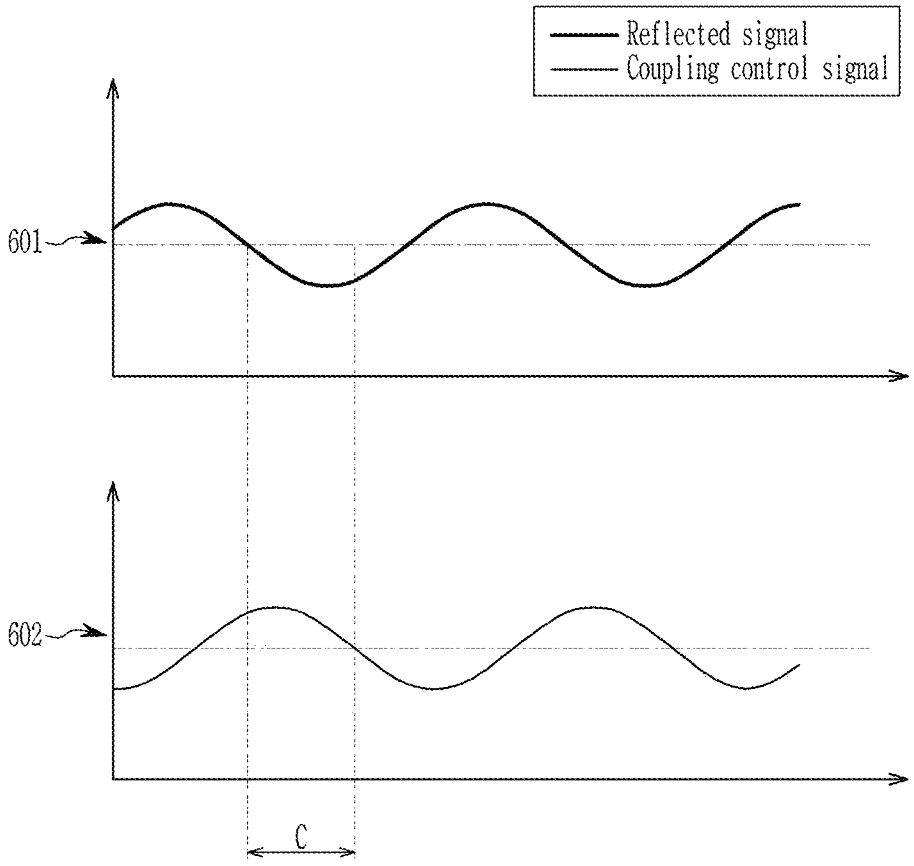

FIG. 6 and FIG. 7 respectively illustrate a relationship between a coupling control signal applied by the edge bias supply portion 40 and a reflected signal according to another embodiment.

The reflected signal is shown in graph 601, and the coupling control signal is shown in graph 602. The horizontal axis may represent time, and the vertical axis may represent voltage, which may be the magnitude of the signal.

Referring to FIG. 6, the edge bias supply portion 40 may apply a coupling control signal with a phase difference (B) between more than about 180° and less than about 360° relative to the reflected signal.

In addition, referring to FIG. 7, the edge bias supply portion 40 may apply a coupling control signal with a phase difference (C) between more than about 0° and less than about 180° relative to the reflected signal.

The coupling control signal and the reflected signal may be synthesized to generate a synthetic signal. The synthetic signal may have a changed phase compared to the reflected signal. In other words, the synthetic signal may have a phase difference between more than about 0° and less than about 360° relative to the reflected signal.

The amplitude of the coupling control signal may be larger than that of the reflected signal. The amplitude of the coupling control signal may be smaller than that of the reflected signal. The amplitude of the coupling control signal may be the same as that of the reflected signal. The amplitude and phase of the synthetic signal may be adjusted depending on the amplitude of the coupling control signal.

Figure 8:
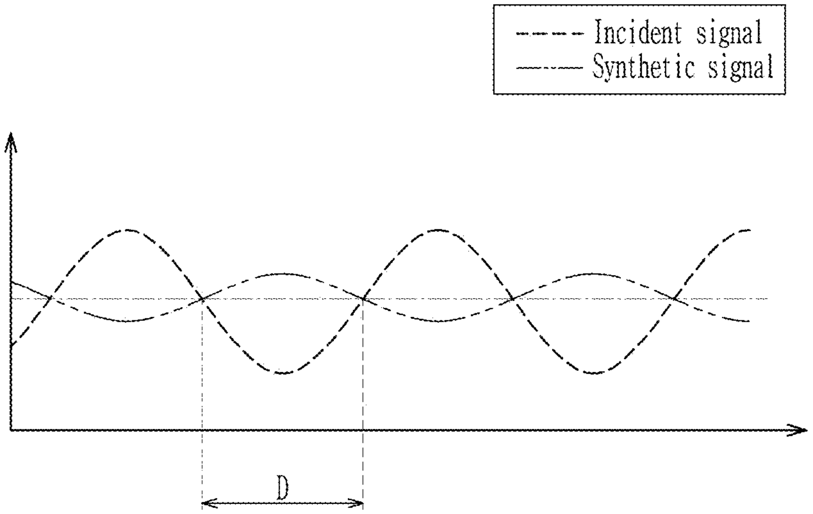
FIG. 8 illustrates a relationship between an incident signal and a synthetic signal according to an embodiment.

FIG. 8 illustrates a relationship between an incident signal and a synthetic signal according to an embodiment.

Referring to FIG. 8, the synthetic signal generated by some embodiments according to FIG. 4 to FIG. 7 may have a phase that destructively interferes with the incident signal. That is, the synthetic signal generated by some embodiments according to FIG. 4 to FIG. 7 may have a phase difference (D) of about 180° from the incident signal.

In other words, the synthetic signal may be generated to have a phase difference from the reflected signal. In FIG. 8, the synthetic signal may have a phase difference of about 180° from the incident signal. Accordingly, destructive interference may occur between the incident signal and the synthesized signal.

In addition, the amplitude of the synthetic signal may be adjusted according to the amplitude of the coupling control signal applied by the edge bias supply portion 40. When the amplitude of the synthetic signal is greater than 0 times and less than 1 times the amplitude of the incident signal, the resultant signal generated from the interaction of the incident signal and the synthetic signal may have the same phase as the incident signal and may have a smaller amplitude than the incident signal. When the amplitude of the synthetic signal is 1 times the amplitude of the incident signal, a resultant signal may not be generated due to complete destructive interference. When the amplitude of the synthetic signal is greater than 1 times and less than 2 times the amplitude of the incident signal, the resultant signal generated from the interaction of the incident signal and the synthetic signal may have a phase difference of about 180° from incident signal and may have a smaller amplitude than the incident signal. When the amplitude of the synthetic signal is twice the amplitude of the incident signal, the resultant signal generated from the interaction of the incident signal and the synthetic signal may have a phase difference of about 180° from incident signal and may have the same amplitude as the incident signal. When the amplitude of the synthetic signal exceeds twice the amplitude of the incident signal, the resultant signal generated from the interaction of the incident signal and the synthetic signal may have a phase difference of about 180° from incident signal and may have a larger amplitude than the incident signal.

Figure 9:
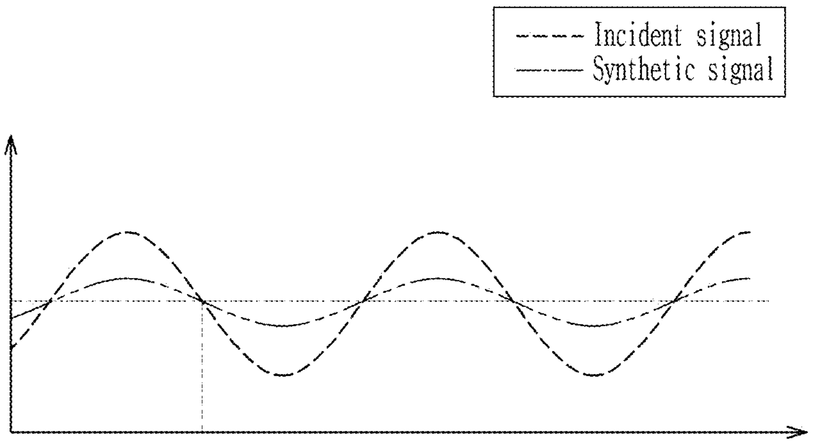
FIG. 9 illustrates a relationship between an incident signal and a synthetic signal according to another embodiment.

FIG. 9 illustrates a relationship between an incident signal and a synthetic signal according to another embodiment.

Referring to FIG. 9, the synthetic signal generated by some embodiments according to FIG. 4 to FIG. 7 may have a phase that constructively interferes with the incident signal. That is, the synthetic signal generated by some embodiments according to FIG. 4 to FIG. 7 may be in the same phase as the incident signal (that is, a phase difference of 0°).

In other words, the synthetic signal may be generated to have a phase difference from the reflected signal. In FIG. 9, the synthetic signal may have the same phase as the incident signal. Accordingly, the incident signal and the synthetic signal may constructively interfere, and a resultant signal that has the same phase as the incident signal and has a larger amplitude than the incident signal may be generated.

Figure 10:
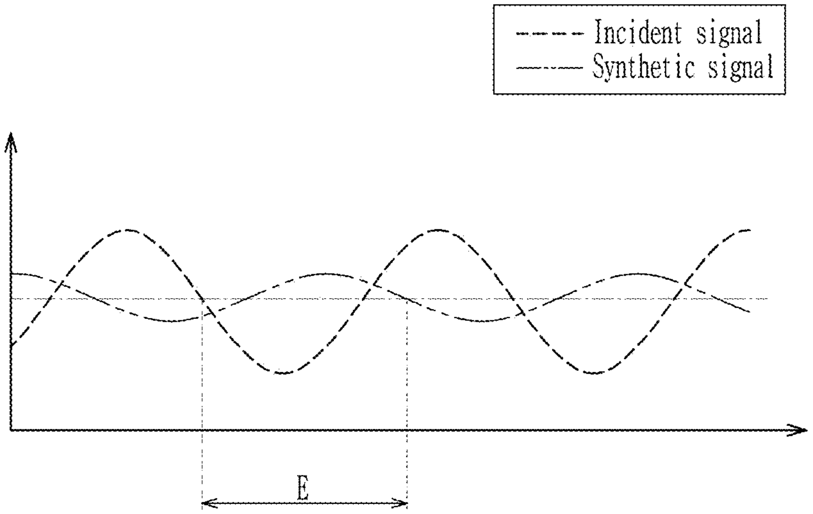
FIG. 10 and FIG. 11 respectively illustrate a relationship between an incident signal and a synthetic signal according to another embodiment.
Figure 11:
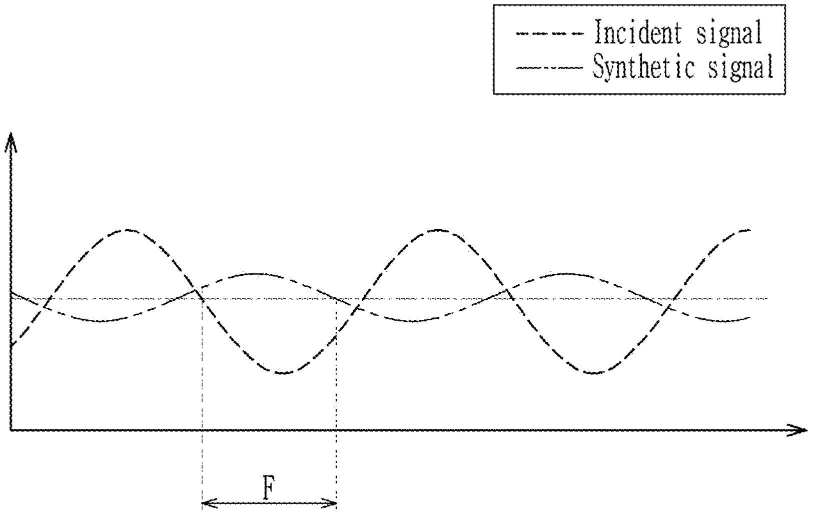

FIG. 10 and FIG. 11 respectively illustrate a relationship between an incident signal and a synthetic signal according to another embodiment.

Referring to FIG. 10 and FIG. 11, the synthetic signal generated in some embodiments according to FIG. 4 to FIG. 7 may have a phase difference from the incident signal. That is, as shown in FIG. 10, the synthetic signal may have a phase difference (E) of more than 180° and less than 360° from the incident signal. In addition, as shown in FIG. 11, the synthetic signal may have a phase difference (F) of more than 0° and less than 180° from the incident signal.

Accordingly, the resultant signal applied to the edge bias supply portion 40 by the coupling signal and the coupling control signal may be in a form in which the phase, or the phase and amplitude, may be adjusted compared to the coupling signal.

Figure 12:
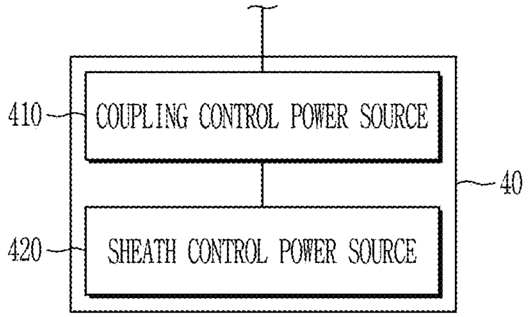
FIG. 12 illustrates an edge bias supply portion according to an embodiment.

FIG. 12 illustrates an edge bias supply portion 40 according to an embodiment.

Referring to FIG. 12, the edge bias supply portion 40 may include a coupling control power source 410 and a sheath control power source 420.

The coupling control power source 410 may apply the coupling control signal to the edge bias electrode 27. That is, the coupling control power source 410 may apply the coupling control signal to the edge bias electrode 27 as in some embodiments described herein with reference to FIG. 4 to FIG. 7.

The sheath control power source 420 may apply the sheath control signal to the edge bias electrode 27. The sheath control power source 420 and the coupling control power source 410 may be provided as voltage sources connected to each other in series. The sheath control signal may have a frequency different from that of the coupling control signal. In addition, the sheath control signal may have a waveform different from that of the coupling control signal. For example, the sheath control signal may be a square wave or the like. The frequency of the sheath control power source 420 may be smaller than the frequency of the excitation supply portion 33.

According to an embodiment, the edge bias supply portion 40 may allow a signal optimized for controlling the state of the sheath to be applied to the edge bias electrode 27. That is, the edge bias supply portion 40 may apply a sheath control signal for controlling the sheath separately from the coupling control signal for controlling the coupling signal.

The coupling signal may be generated even when the edge bias supply portion 40 is in the off state. In a comparative embodiment, the signal applied to the edge bias electrode 27 may be synthesized with the coupling signal, and the signal at the edge bias electrode 27 may become larger than the coupling signal.

A synthetic signal of the reflected signal and the coupling control signal may be applied to the edge bias electrode 27 by the coupling control signal applied by the edge bias supply portion 40. In this case, the synthetic signal may have a smaller amplitude or a larger amplitude than the reflected signal. In addition, the synthetic signal may be in a phase-changed state compared to the reflected signal. In addition, the synthetic signal may interfere destructively or constructively with the incident signal, or may change the phase of the incident signal. Accordingly, when the coupling control signal is applied in a form that substantially cancels the coupling signal, the sheath control signal may be applied to the edge bias electrode 27. That is, a signal smaller than the coupling signal may ultimately be applied to the edge bias electrode 27. In addition, a signal having a waveform according to the sheath control signal may be applied to the edge bias electrode 27 with the coupling signal substantially reduced.

Figure 13:
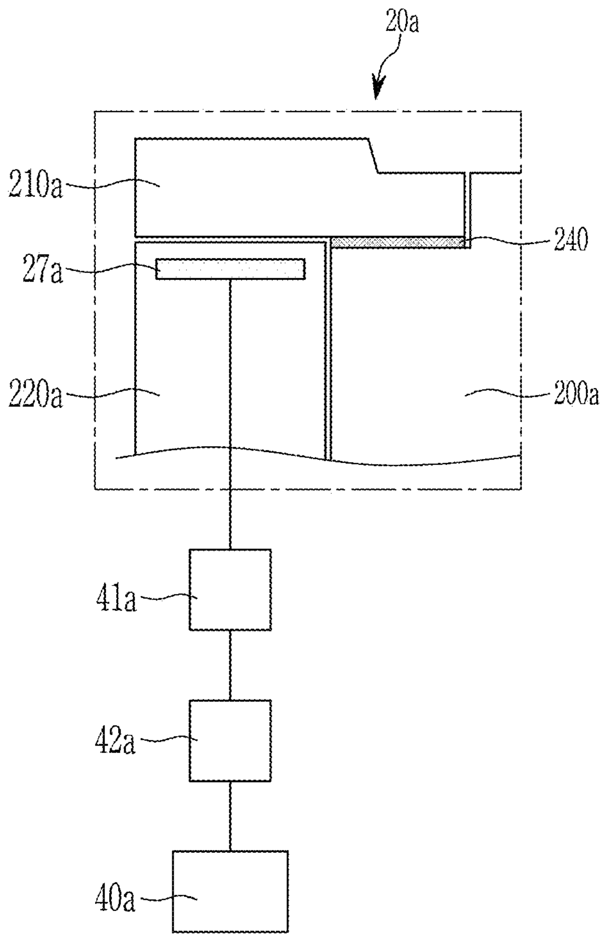
FIG. 13 illustrates an upper portion of a support member according to another embodiment.

FIG. 13 illustrates an upper portion of a support member **20*a*** according to another embodiment.

Referring to FIG. 13, a support member **20*a* may include a support plate 200*a*, a focus ring 210*a*, a support ring 220*a*, and a thermal pad 240**.

The support plate **200*a*, the focus ring 210*a*, and the support ring 220*a* may be the same as or similar to the support plate 200, the focus ring 210, and the support ring 220 described with reference to FIG. 2**, and repeated descriptions thereof may be omitted.

An edge bias electrode **27*a* may be disposed below the focus ring 210*a***.

The edge bias electrode **27*a* may be the same as or similar to the edge bias electrode 27 described above in FIG. 1 and FIG. 2**, and repeated descriptions thereof may be omitted.

An edge bias supply portion **40*a*, an impedance control member 42*a*, and a measurement member 41*a* may be connected to the edge bias electrode 27*a*. Since the edge bias supply portion 40*a*, the impedance control member 42*a*, and the measurement member 41*a* may be the same as or similar to the edge bias supply portion 40, the impedance control member 42, and the measurement member 41 described with reference to FIG. 1 to FIG. 12**, repeated descriptions thereof may be omitted.

The thermal pad 240 may be disposed between the focus ring 210*a* and the support plate 200*a*. The thermal pad 240 may be disposed between a lower surface of the focus ring 210*a* and an upper surface of the support plate 200*a*. The thermal pad 240 may be made of a material having higher thermal conductivity than the focus ring 210*a*. Accordingly, the thermal pad 240 may improve thermal conductivity between the focus ring 210*a* and the support plate 200*a*. As the thermal conductivity is improved, a temperature difference between the focus ring 210*a* and the support plate 200*a* may be reduced during the fixing process.

When the thermal conductivity between the focus ring 210*a* and the support plate 200*a* increases, the magnitude of the coupling signal generated in the edge bias electrode 27*a* may increase. In this case, by adjusting the coupling signal through the coupling control signal supplied by the edge bias supply portion 40*a*, a change in the signal applied to the edge bias electrode 27*a* by the thermal pad 240 may be reduced.

Figure 14:
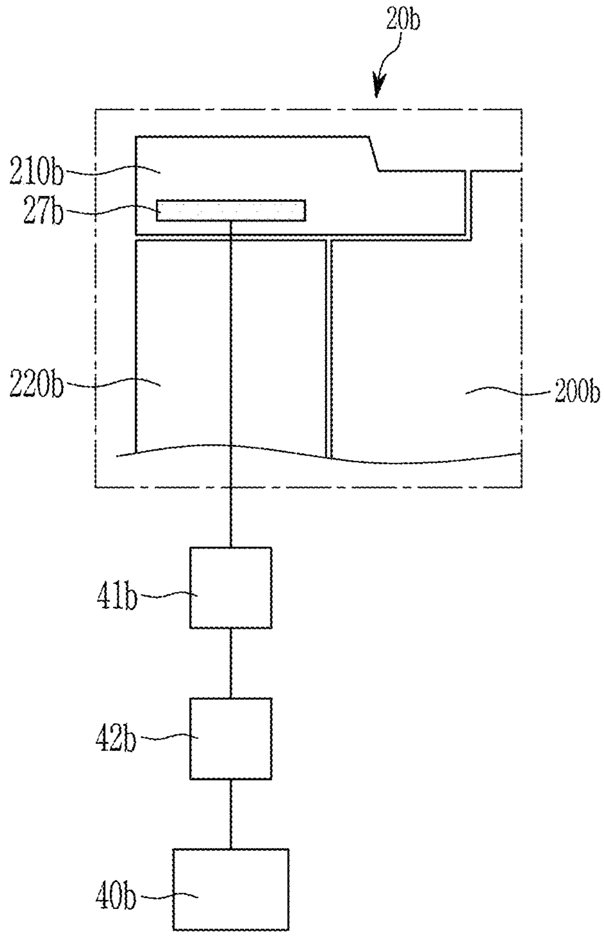
FIG. 14 illustrates an upper portion of a support member according to another embodiment.

FIG. 14 illustrates an upper portion of a support member 20*b* according to another embodiment.

Referring to FIG. 14, the support member 20*b* may include a support plate 200*b*, a focus ring 210*b*, and a support ring 220*b*.

The support plate 200*b*, the focus ring 210*b*, and the support ring 220*b* may be the same as or similar to the support plate 200, the focus ring 210, and the support ring 220 described with reference to FIG. 2, and repeated descriptions thereof may be omitted.

In addition, a thermal pad may be disposed between the focus ring 210*b* and the support plate 200*b* in the same or similar manner as described above in FIG. 13, and repeated descriptions thereof may be omitted.

An edge bias electrode 27*b* may be disposed inside the focus ring 210*b*. In other respects, the edge bias electrode 27*b* may be the same as or similar to the edge bias electrode 27 described with reference to FIG. 1 and FIG. 2, and repeated descriptions thereof will be omitted.

An edge bias supply portion 40*b*, an impedance control member 42*b*, and a measurement member 41*b* may be connected to the edge bias electrode 27*b*. The edge bias supply portion 40*b*, the impedance control member 42*b*, and the measurement member 41*b* may be the same as or similar to the edge bias supply portion 40, the impedance control member 42, and the measurement member 41 described with reference to FIG. 1 to FIG. 12, and repeated descriptions thereof may be omitted.

Figure 15:
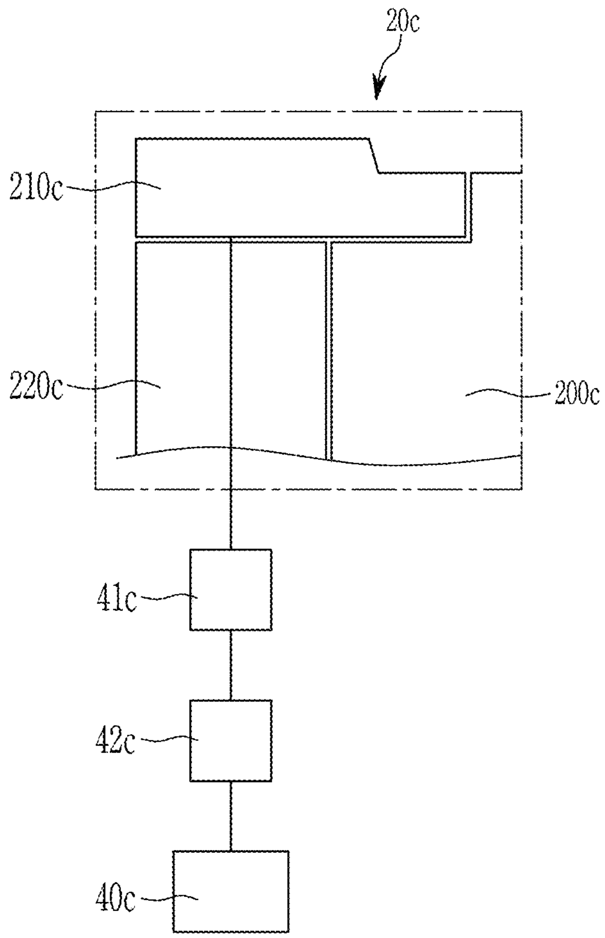
FIG. 15 illustrates an upper portion of a support member according to another embodiment.

FIG. 15 illustrates an upper portion of a support member 20*c* according to another embodiment.

Referring to FIG. 15, the support member 20*c* may include a support plate 200*c*, a focus ring 210*c*, and a support ring 220*c*.

The support plate 200*c*, the focus ring 210*c*, and the support ring 220*c* may be the same as or similar to the support plate 200, the focus ring 210, and the support ring 220 described with reference to FIG. 2, and repeated descriptions thereof may be omitted.

In addition, a thermal pad may be disposed between the focus ring 210*c* and the support plate 200*c* in the same or similar manner as described above in FIG. 13, and repeated descriptions thereof may be omitted.

An edge bias supply portion 40*c*, an impedance control member 42*c*, and a measurement member 41*c* may be connected to the focus ring 210*c*. The focus ring 210*c* may function as the edge bias electrode 27 described in FIG. 1 to FIG. 12. The focus ring 210*c* may function as an edge bias electrode, the function of the edge bias electrode may be the same as or similar to the edge bias electrode 27 described above in FIG. 1 to FIG. 12, and repeated descriptions thereof may be omitted.

The edge bias supply portion 40*c*, the impedance control member 42*c*, and the measurement member 41*c* may be the same as or similar to the edge bias supply portion 40, the impedance control member 42, and the measurement member 41 described with reference to FIG. 1 to FIG. 12, and repeated descriptions thereof may be omitted.

Figure 16:
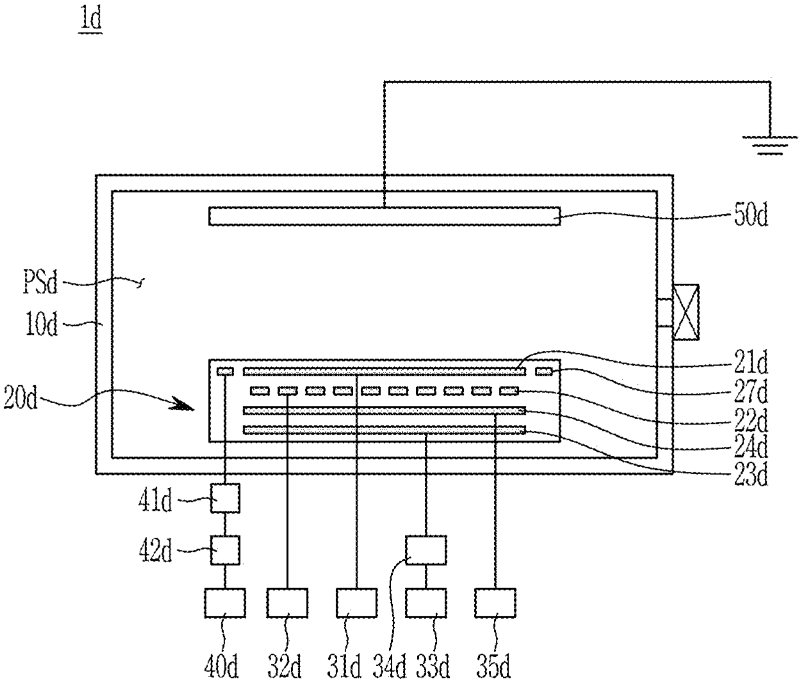
FIG. 16 illustrates a substrate processing apparatus according to another embodiment.

FIG. 16 illustrates a substrate processing apparatus 1*d* according to another embodiment.

Referring to FIG. 16, the substrate processing apparatus 1*d* according to another embodiment may include a chamber 10*d*, a support member 20*d*, and a plasma excitation member 50*d*.

The inside of the chamber 10*d* may define a process space PSd. A substrate processing process may be performed within the process space PSd.

The support member 20*d* may be disposed inside the chamber 10*d*. The support member 20*d* may include a fixing electrode 21*d*, a heating member 22*d*, a lower electrode 23*d*, a bias electrode 24*d*, and an edge bias electrode 27*d*.

A fixing supply portion 31*d*, a heating supply portion 32*d*, an excitation supply portion 33*d*, a matcher 34*d*, a bias supply portion 35*d*, an edge bias supply portion 40*d*, an impedance control member 42*d*, and a measurement member 41*d* may be connected to the support member 20*d*.

The lower electrode 23*d* may be disposed inside the support member 20*d*.

The bias electrode 24*d* may be disposed inside the support member 20*d*. The bias supply portion 35*d* may be connected to the support member 20*d*. The bias supply portion 35*d* may be electrically connected to the bias electrode 24*d*.

The chamber 10*d* and the plasma excitation member 50*d* may be the same as or similar to the substrate processing apparatus 1 of FIG. 1, and repeated descriptions thereof may be omitted.

The bias electrode 24*d* may be provided separately from the lower electrode 23*d*. In other respects, the structure of the support member 20*d*, and the fixing supply portion 31*d*, the heating supply portion 32*d*, the excitation supply portion 33*d*, the matcher 34*d*, the bias supply portion 35*d*, the edge bias supply portion 40*d*, the impedance control member 42*d*, and the measurement member 41*d* that are connected to the support member 20*d* may be the same as or similar to some embodiments described with reference to FIG. 1 to FIG. 15. Accordingly, repeated descriptions thereof may be omitted.

Figure 17:
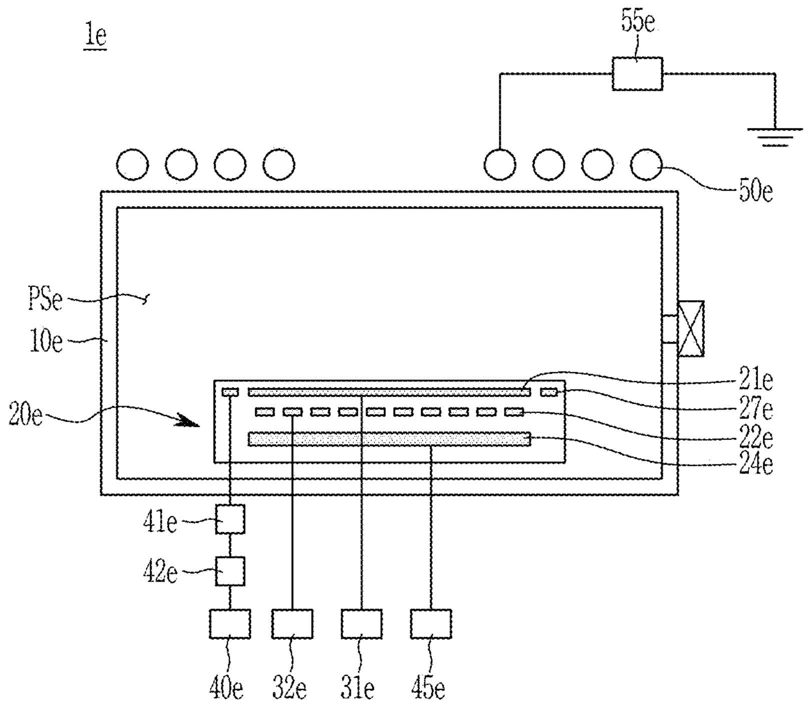
FIG. 17 illustrates a substrate processing apparatus according to another embodiment.

FIG. 17 illustrates a substrate processing apparatus 1*e* according to another embodiment.

Referring to FIG. 17, the substrate processing apparatus 1*e* according to another embodiment may include a chamber 10*e*, a support member 20*e*, and a plasma excitation member 503.

The chamber 10*e* may define a process space PSe. A substrate processing process may be performed within the process space PSe. At least a portion of an upper wall of the chamber 10*e* may be made of a dielectric material. In other respects, the chamber 10*e* may be the same as or similar to those of the chamber 10 of FIG. 1, and repeated descriptions thereof may be omitted.

The support member 20*e* may be disposed inside the chamber 10*e*. The support member 20*e* may include a fixing electrode 21*e*, a heating member 22*e*, a bias electrode 24*e*, and an edge bias electrode 27*e*.

A fixing supply portion 31*e*, a heating supply portion 32*e*, a bias supply portion 45*e*, an edge bias supply portion 40*e*, an impedance control member 42*e*, and a measurement member 41*e* may be connected to the support member 20*e*.

The fixing supply portion 31*e* may be electrically connected to the fixing electrode 21*e*. The heating supply portion 32*e* may be electrically connected to the heating member 22*e*. The bias supply portion 45*e* may be electrically connected to the bias electrode 24*e*. The edge bias supply portion 40*e*, the impedance control member 42*e*, and the measurement member 41*e* may be electrically connected to the edge bias electrode 27*e*.

The lower electrode 23 described above in FIG. 1 may be omitted from the support member 20*e*. Accordingly, the excitation supply portion 33 and the matcher 34, which are electrically connected to the lower electrode 23 described with reference to FIG. 1, may not be connected to the support member 20*e*. The lower electrode 23*d* described with reference to FIG. 16 may be omitted from the support member 20*e*. Accordingly, the excitation supply portion 33*d* and the matcher 34*d*, which are electrically connected to the lower electrode 23*d* described with reference to FIG. 16, may not be connected to the support member 20*e*. The remaining structure of the support member 20*e*, and the fixing supply portion 31*e*, the heating supply portion 32*e*, the bias supply portion 45*e*, the edge bias supply portion 40*e*, the impedance control member 42*e*, and the measurement member 41*e* that are connected to the support member 20*e* may be the same as or similar to some embodiments described with reference to FIG. 1 to FIG. 16. Accordingly, repeated descriptions thereof may be omitted.

The plasma excitation member 50*e* may allow energy for excitation of plasma to be applied to the inside of the chamber 10*e*. The plasma excitation member 50*e* may have an antenna structure. The plasma excitation member 50*e* may be disposed outside of the chamber 10*e*. The plasma excitation member 50*e* may be disposed adjacent to the upper surface of the upper wall of the chamber 10*e*. The plasma excitation member 50*e* may be disposed to face the inner space of the chamber 10*e*, with the upper wall of the chamber 10*e* interposed therebetween.

The plasma excitation member 50*e* may be electrically connected to the excitation supply portion 55*e*. The excitation supply portion 55*e* may be provided as a high-frequency power source that is configured to generate high-frequency power. The excitation supply portion 55*e* may be provided as an RF power source. The plasma excitation member 50*e* may generate an electromagnetic wave through the power provided by the excitation supply portion 55*e*. The gas supplied into the chamber 10*e* may be excited by the plasma by the electromagnetic wave generated by the plasma excitation member 50*e*.

While embodiment of the present disclosure has been described in connection with what is presently considered to be practical embodiments, it is to be understood that the disclosure is not limited to example embodiments, but, on the contrary, is intended to cover various modifications and equivalent arrangements included within the spirit and scope of the appended claims.

DESCRIPTION OF SYMBOLS

10: chamber
20: support member
21: fixing electrode
22: heating member
23: lower electrode
27: edge bias electrode
31: fixing supply portion
32: heating supply portion
33: excitation supply portion
34: matcher
35: bias supply portion
40: edge bias supply portion
41: measurement member
42: impedance control member
50: plasma excitation member

What is claimed is:

1. A substrate processing apparatus comprising:
a chamber;
a support member disposed inside the chamber and including a bias electrode and an edge bias electrode;
a bias supply portion electrically connected to the bias electrode; and
an edge bias supply portion electrically connected to the edge bias electrode,
wherein the edge bias supply portion applies a coupling control signal having a frequency corresponding to a coupling signal, and
the coupling signal is generated at the edge bias electrode by coupling with a bias signal generated at the bias electrode,
wherein
the coupling signal includes an incident signal traveling in a direction from the edge bias electrode to the edge bias supply portion, and a reflected signal traveling in a direction from the edge bias supply portion to the edge bias electrode, and
wherein the edge bias supply portion applies the coupling control signal having a frequency corresponding to the reflected signal.

2. The substrate processing apparatus of claim 1, further comprising
a measurement member electrically connected to the edge bias electrode,
wherein the measurement member measures the coupling signal.

3. The substrate processing apparatus of claim 2, wherein the measurement member is disposed between the edge bias electrode and the edge bias supply portion.

4. The substrate processing apparatus of claim 2, further comprising
an impedance control member electrically connected to the edge bias electrode,
wherein the impedance control member controls the coupling signal.

5. The substrate processing apparatus of claim 4, wherein the measurement member is disposed between the impedance control member and the edge bias electrode.

6. The substrate processing apparatus of claim 1, wherein the coupling control signal has a phase that destructively interferes with the reflected signal.

7. The substrate processing apparatus of claim 1, wherein the coupling control signal has a phase that constructively interferes with the reflected signal.

8. The substrate processing apparatus of claim 1, wherein a synthetic signal generated by combining the coupling control signal and the reflected signal has a phase difference between more than 0° and less than 360° relative to the reflected signal.

9. The substrate processing apparatus of claim 1, wherein a synthetic signal generated by combining the coupling control signal and the reflected signal has a phase that destructively interferes with the incident signal.

10. The substrate processing apparatus of claim 1, wherein a synthetic signal generated by combining the coupling control signal and the reflected signal has a phase that constructively interferes with the incident signal.

11. The substrate processing apparatus of claim 1, wherein a synthetic signal generated by combining the coupling control signal and the reflected signal has a phase difference between more than 0° and less than 180° relative to the incident signal.

12. The substrate processing apparatus of claim 1, wherein a synthetic signal generated by combining the coupling control signal and the reflected signal has a phase difference between more than 180° and less than 360° relative to the incident signal.

13. A substrate processing apparatus comprising:

a chamber;

a support member disposed inside the chamber and including a bias electrode and an edge bias electrode;

a bias supply portion electrically connected to the bias electrode;

an edge bias supply portion electrically connected to the edge bias electrode; and a measurement member electrically connected to the edge bias electrode, wherein the measurement member measures a coupling signal generated at the edge bias electrode by coupling with a bias signal generated at the bias electrode, wherein the edge bias supply portion applies a coupling control signal, wherein the coupling signal includes an incident signal traveling in a direction from the edge bias electrode to the edge bias supply portion, and a reflected signal traveling in a direction from the edge bias supply portion to the edge bias electrode, and wherein the edge bias supply portion applies the coupling control signal having a frequency corresponding to the reflected signal.

14. The substrate processing apparatus of claim 13, wherein the support member comprises:

a support plate;

a focus ring disposed on an outer periphery of an upper portion of the support plate; and a support ring disposed below the focus ring, wherein the edge bias electrode is disposed inside the support ring.

15. The substrate processing apparatus of claim 14, wherein the support member comprises:

a support plate;

a focus ring disposed on an outer periphery of an upper portion of the support plate; and a support ring disposed below the focus ring, wherein the edge bias electrode is disposed inside the focus ring.

16. The substrate processing apparatus of claim 14, wherein the support member comprises:

a support plate;

a focus ring disposed on an outer periphery of an upper surface of the support plate; and a support ring disposed below the focus ring, wherein the focus ring is electrically connected to the edge bias supply portion and functions as the edge bias electrode.

17. A substrate processing apparatus comprising:

a chamber;

a support member disposed inside the chamber and including a bias electrode and an edge bias electrode;

a bias supply portion electrically connected to the bias electrode;

an edge bias supply portion electrically connected to the edge bias electrode; and a measurement member electrically connected to the edge bias electrode, wherein the measurement member measures a coupling signal generated at the edge bias electrode by coupling with a bias signal generated at the bias electrode, and the edge bias supply portion applies a coupling control signal having a frequency corresponding to a reflected signal to generate a synthetic signal in which at least one of an amplitude or a phase of the synthetic signal is different than an amplitude or a phase of the reflected signal, wherein the reflected signal is a portion of the coupling signal and traveling in a direction from the edge bias supply portion toward the edge bias electrode.

18. The substrate processing apparatus of claim 17, wherein the edge bias supply portion comprises:

a coupling control power source that applies the coupling control signal; and a sheath control power source that applies a sheath control signal whose frequency or waveform is different from the coupling control signal.

* * * * *